(12) United States Patent
Gershon et al.

(10) Patent No.: US 9,608,141 B1
(45) Date of Patent: Mar. 28, 2017

(54) FLUORINATED TIN OXIDE BACK CONTACT FOR AZTSSE PHOTOVOLTAIC DEVICES

(71) Applicant: International Business Machines Corporation, Armonk, NY (US)

(72) Inventors: Talia S. Gershon, White Plains, NY (US); Oki Gunawan, Westwood, NJ (US); Richard A. Haight, Mahopac, NY (US); Yun Seog Lee, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/968,252

(22) Filed: Dec. 14, 2015

(51) Int. Cl.
*H01L 31/032* (2006.01)
*H01L 31/18* (2006.01)
*H01L 31/0224* (2006.01)
*H01L 31/07* (2012.01)

(52) U.S. Cl.
CPC ........ *H01L 31/022441* (2013.01); *H01L 31/022433* (2013.01); *H01L 31/022466* (2013.01); *H01L 31/0326* (2013.01); *H01L 31/07* (2013.01); *H01L 31/1864* (2013.01); *H01L 31/1884* (2013.01)

(58) Field of Classification Search
CPC ..... H01L 31/022441; H01L 31/022466; H01L 31/0326; H01L 31/0327; H01L 31/18; H01L 31/0322; H01L 31/0749; H01L 31/022425; H01L 31/1884; H01L 31/03923; H01L 31/02568
See application file for complete search history.

(56) References Cited

U.S. PATENT DOCUMENTS 8,647,910 B2   2/2014  Cheng
9,136,413 B2   9/2015  Cheng et al.
(Continued)

FOREIGN PATENT DOCUMENTS

DE    102013113590 A1    6/2015
JP    WO 2013129275 A2 *  9/2013    ......... H01L 31/0326
(Continued)

OTHER PUBLICATIONS

Sarswat, et al "A Study of Increased Resistivity of FTO Back Contact for CZTS Based Absorber Material Grown by Electrodeposition-Annealing Route" Mater. Res. Soc. Symp. Proc. vol. 1315, 2011, pp. 83-88.*

(Continued)

*Primary Examiner* — Marla D McConnell
(74) *Attorney, Agent, or Firm* — Cantor Colburn LLP; Vazken Alexanian

(57) ABSTRACT

A photovoltaic device includes a substrate, a back contact comprising a stable low-work function material, a photovoltaic absorber material layer comprising $Ag_2ZnSn(S,Se)_4$ (AZTSSe) on a side of the back contact opposite the substrate, wherein the back contact forms an Ohmic contact with the photovoltaic absorber material layer, a buffer layer or Schottky contact layer on a side of the absorber layer opposite the back contact, and a top electrode on a side of the buffer layer opposite the absorber layer.

18 Claims, 6 Drawing Sheets

(56) References Cited

U.S. PATENT DOCUMENTS

2012/0138136 A1* 6/2012 Meissner ............ H01L 31/0326
　　　　　　　　　　　　　　　　　　　　　　136/256
2012/0199173 A1* 8/2012 Bartholomeusz ... H01L 31/0326
　　　　　　　　　　　　　　　　　　　　　　136/244
2014/0048122 A1　2/2014 Fogel et al.

FOREIGN PATENT DOCUMENTS

KR　1020080090226 A　10/2008
KR　　100877517 B1　1/2009

OTHER PUBLICATIONS

Sasamura, et al "Solution-phase Synthesis of Stannite-type Ag2ZnSnS4 Nanoparticles for Application to Photoelectrode Materials," Chem. Lett, 2012 (published online Sep. 8, 2012), pp. 1009-1011.*

E. Fortunato, et al.,"Transparent Conducting Oxides for Photovoltaics", MRS Bulletin, vol. 32, Mar. 2007, p. 1-6.

R. Caballero, et at,"CGS-Thin Films Solar Cells on Transparent Back Contact", Conference Record of the IEEE 4th world conference on Photovoltaic Energy Conversasion, vol. 1, May 2006, p. 1-4.

* cited by examiner

FLUORINATED TIN OXIDE BACK CONTACT FOR AZTSSE PHOTOVOLTAIC DEVICES

FEDERALLY SPONSORED RESEARCH AND DEVELOPMENT

This invention was made with government support under contract number DE-EE0006334 awarded by the Department of Energy. The government may have certain rights in the invention.

BACKGROUND

The present invention generally relates to AZTSSe ($Ag_2ZnSn(S,Se)_4$) photovoltaic devices, and more specifically, to fluorinated tin oxide back contacts for AZTSSe photovoltaic devices.

Solar technology is a viable alternative to traditional energy sources. Energy produced by solar technology can generate a savings both in terms of costs and in its impact on the environment.

A photovoltaic device is a device that converts the energy of incident photons to electrical power. Typical photovoltaic devices include solar cells, which are configured to convert the energy in the electromagnetic radiation from the Sun to electric energy. Each photon has an energy given by the formula $E=h\nu$, in which the energy E is equal to the product of the Planck's constant h and the frequency $\nu$ of the electromagnetic radiation associated with the photon.

Thin film photovoltaics have been the focus of current research. Thin film photovoltaic devices offer advantages over their traditional photovoltaic panel counterparts in terms of manufacturing costs, versatility, etc. There is an increased demand for novel chalcogenide materials for use as absorber layers in thin film solar cells.

SUMMARY

In an embodiment of the invention, a photovoltaic device is provided that includes a substrate, a back contact comprising a stable low-work function material; a photovoltaic absorber material layer comprising $Ag_2ZnSn(S,Se)_4$ (AZTSSe) on a side of the back contact opposite the substrate; wherein the back contact forms an Ohmic contact with the photovoltaic absorber material layer, a buffer layer or a Schottky contact layer on a side of the absorber layer opposite the back contact, and a top electrode on a side of the buffer layer opposite the absorber layer.

In another embodiment of the invention, a method for making a photovoltaic device that includes the steps of providing a substrate, forming a back contact comprising a stable low-work function material on the substrate, forming a photovoltaic absorber material layer comprising $Ag_2ZnSn(S,Se)_4$ (AZTSSe) on a side of the back contact opposite the substrate wherein an Ohmic contact is formed between the stable low-work function material and the photovoltaic absorber material layer comprising $Ag_2ZnSn(S,Se)_4$ (AZTSSe), forming a buffer layer or a Schottky contact layer on a side of the absorber layer opposite the back contact, and forming a top electrode on a side of the buffer layer opposite the absorber layer.

In another embodiment of the invention, a photovoltaic device is provided that includes a glass substrate, a back contact comprising fluorinated tin oxide ($SnO_2$:F or FTO), a photovoltaic absorber material layer comprising $Ag_2ZnSn(S,Se)_4$ (AZTSSe) on a side of the back contact opposite the substrate, wherein the back contact forms an Ohmic contact with the photovoltaic absorber material layer; a buffer layer or a Schottky contact layer on a side of the absorber layer opposite the back contact, a top electrode on a side of the buffer layer or Schottky contact layer opposite the absorber layer, and a metal contact grid on a side of the top electrode opposite the buffer layer or Schottky contact layer.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
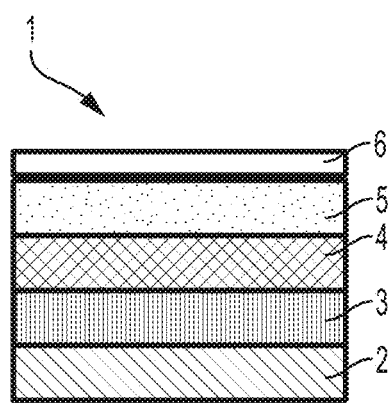
FIG. 1 shows a schematic of an embodiment of the photovoltaic device comprising an AZTSSe photovoltaic absorber layer and an FTO back contact.

As stated above, the present invention relates to photovoltaic devices, and particularly to a photovoltaic device comprising an AZTSSe photovoltaic absorber layer, which are now described in detail with accompanying figures. It is noted that like reference numerals refer to like elements across different embodiments.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As used herein, a "photovoltaic device" is a device, such as a solar cell, that produces free electrons-hole pairs, when exposed to radiation, such as light, and can be collected to produce an electric current. The photovoltaic device typically includes layers of p-type conductivity and n-type conductivity that share an interface to provide a junction. The "absorption layer" of the photovoltaic device is the material that readily absorbs photons to generate charge carriers, i.e., free electrons or holes. A portion of the photovoltaic device, between the front side and the junction is referred to as the "buffer layer", and the junction is referred to as the "buffer junction". The buffer layer may be present atop the absorption layer, in which the buffer layer has a conductivity type that is opposite the conductivity type as the absorption layer. In one example, when the Sun's energy in the form of photons collects in the cell layers, electron-hole pairs are generated in the material within the photovoltaic device. The buffer junction provides the required electric field for the collection of the photo-generated holes and electrons on the p-doped and n-doped sides of the buffer junction, respectively. In many examples, at least one p-type layer of the photovoltaic device may provide the absorption layer, and at least one adjacent n-type layer may provide the buffer layer.

Some photovoltaic devices contain $Cu_2ZnSn(S,Se)_4$ (CZTSSe) as the photovoltaic absorber material. Here, the inventive photovoltaic device substitutes silver (Ag) for copper (Cu) to suppress bulk defects in the photovoltaic device. However, AZTSSe is intrinsically n-type (as opposed to most other thin film absorbers which are p-type), therefore other aspects of the device must be re-optimized. Molybdenum (Mo) is typically used as the back contact material for copper indium gallium selenide (CIGS) and CZTSSe photovoltaic devices; however, it is non-Ohmic to AZTSSe. Without being bound by theory, it is believed that this is in part due to the formation of a high-work function p-type $Mo(S,Se)_2$ layer in between the Mo electrode and the AZTSSe absorber layer.

An Ohmic back contact is used to form the AZTSSe thin film photovoltaic devices. In this instance, the Ohmic back contact preferably comprises a stable low-work function material. As used herein, a high-work function material refers to a material with a work function of 5-6 eV. As used herein, a low-work function material refers to a material with a work function of 4.5 or fewer eV. Further, some low-work function materials (e.g. Ca, Al) are highly reactive with S and Se. Therefore a stable low-work function is used to form a stable Ohmic back contact in AZTSSe thin film photovoltaic devices. As used herein, "stable" refers to a material that is substantially nonreactive with S or Se.

Accordingly, disclosed herein is an AZTSSe thin film photovoltaic device comprising a back contact comprising a stable low-work function material. Suitable stable low-work function materials include fluorinated tin oxide ($SnO_2$:F or FTO), ZnO:Al, ZnO:B, $In_2O_3$:Sn, $In_2O_3$:Zn, $TiB_2$, $LaB_6$, and $TiO_2$:Nb. As used herein, the colon represents doping, e.g., SnO2:F is tin oxide doped with fluorine, which is referred to also herein as fluorinated tin oxide. Preferably the back contact comprises FTO. Various embodiments of the AZTSSe thin film photovoltaic device are described in detail below.

In an embodiment, as shown in FIG. 1, the photovoltaic device 1 comprises an FTO-coated glass substrate 2. The FTO-coated glass substrate 2 can be produced by depositing FTO onto a glass substrate, for example using a spray pyrolysis technique. Alternatively, the FTO-coated glass substrate 2 can be purchased from a commercial vendor. The photovoltaic device 1 further comprises a photovoltaic absorber material layer comprising AZTSSe 3. The FTO glass substrate 2 and photovoltaic absorber material layer comprising AZTSSe 3 are in Ohmic contact with each other.

In one embodiment, the FTO-coated glass substrate 2 is coated with NaF in order to introduce Na as a dopant to the photovoltaic absorber material layer comprising AZTSSe 3. In one embodiment, the ratio of Ag to Sn in the AZTSSe material is about 1.6 to about 2.3, specifically about 1.7 to about 2.2, and more specifically about 1.8 to about 2.1. In one embodiment, the ratio of Zn to Sn in the AZTSSe material is about 0.75 to about 1.45, specifically about 0.85 to about 1.35, and more specifically about 0.95 to about 1.25. In one embodiment, the ratio of (Ag+Zn+Sn) to (S+Se) in the AZTSSe material is about 0.8 to about 1.2, specifically about 0.9 to about 1.1, and more specifically about 1 to about 1. In one embodiment, the ratio of S to Se in the AZTSSe material is about 0 to about 1, specifically about 0.25 to about 0.75, and more specifically about 0.5 to about 0.5. In one embodiment, the AZTSSe material is annealed. In one embodiment, the annealing occurs at a fixed temperature in an S, Se overpressure.

Still referring to FIG. 1, the photovoltaic device 1 further comprises either a p-type buffer layer or a high-work function Schottky layer 4 formed on top of the photovoltaic absorber material layer comprising AZTSSe 3. An example of an appropriate Schottky layer 4 comprises a high-work function material such as $MoO_3$. Alternatively, a p-type semiconductor with a wide band gap would be appropriate for layer 4. A transparent top electrode or contact 5 is formed on top of the p-type buffer or Schottky layer 4. Throughout this disclosure, an element is "transparent" if the element is sufficiently transparent in the visible electromagnetic spectral range. In one embodiment, the transparent top electrode or contact 5 comprises a transparent conductive oxide. Suitable transparent conductive oxides include, but not limited to FTO, an aluminum-doped zinc oxide (ZnO:Al), tin oxide (SnO), and indium tin oxide ($In_2O_3$:$SnO_2$, or ITO). Optionally, the photovoltaic device 1 further comprises a metal contact grid 6 on top of the transparent top electrode or contact 5. The metal contact grid 6 comprises a metal such as Ni or Al and may be used for testing the photovoltaic device 1.

Figure 2:
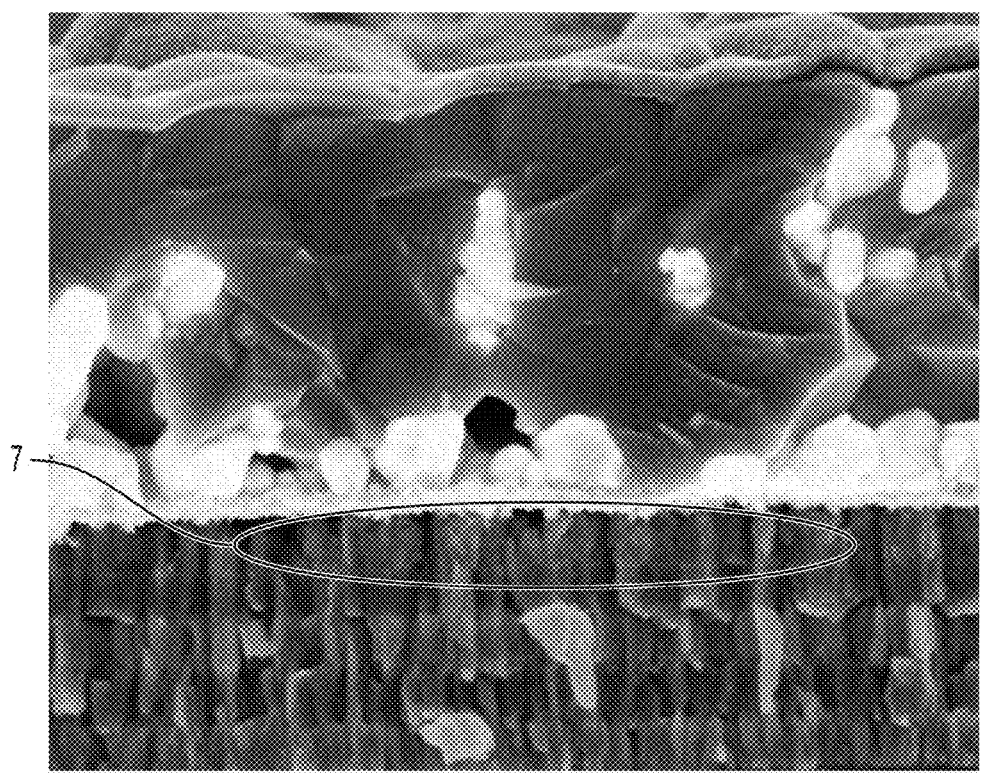
FIG. 2 shows an annealed film grown on a Mo back electrode in which a layer of MoSe2 is seen between the AZTSSe and the Mo due to the reaction of the Mo with Se during an annealing step.

FIG. 2 shows a photomicrograph of a film comprising an AZTSSe material on a Mo back contact. Without being bound by theory, it is thought that $MoSe_2$ is formed at the interface 7. This $MoSe_2$ layer forms during the time that the AZTSSe layer is annealed to form large-grained microstructure. This high-work function material (>5 eV) appears to cause the non-annealed ("as made") AZTSSe films on Mo to give better performance than annealed films despite the smaller grains and poor defect structure as shown in FIG. 3; in the case of annealing, the microstructural benefits of annealing are outweighed by the detrimental non-Ohmic MoSe2 layer that forms.

Figure 3:
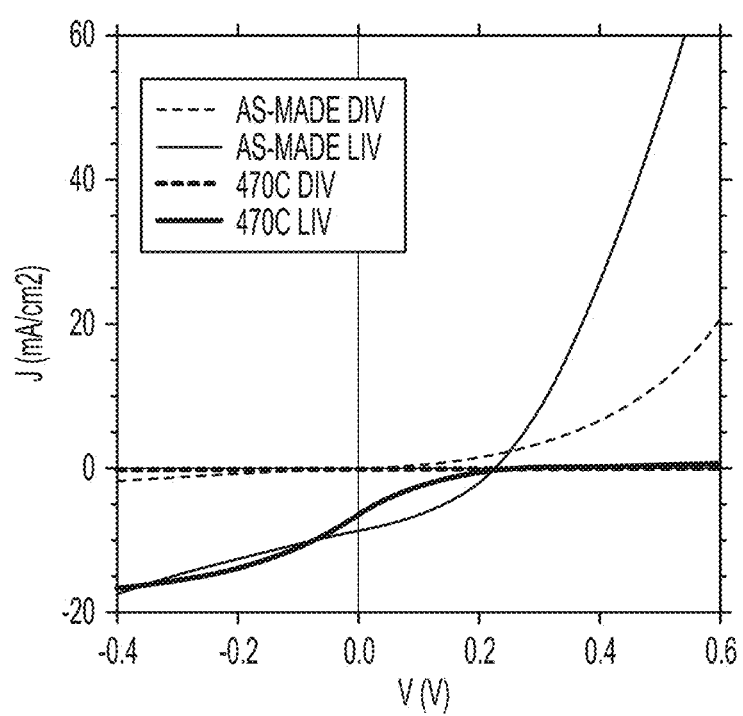
FIG. 3 shows the double-diode behavior caused by the intermediate MoSe2 layer formed between an AZTSSe photovoltaic absorber layer and an Mo back contact, which is made worse by annealing due to increase reaction between Mo and Se.

FIG. 3 shows the current-density curves of non-annealed ("as made") (light lines) and annealed samples (dark lines) of the AZTSSe films on Mo substrates. The solid lines represent current-density vs voltage response curves under solar illumination while the hatched lines represent the same measurements in the dark. The annealed samples did not shift into the fourth quadrant when illuminated. The arrows indicate that the annealed sample produces less electrical power under illumination and also that the MoSe2 layer provides a large blocking barrier to current flow even at large forward biases.

Figure 4:
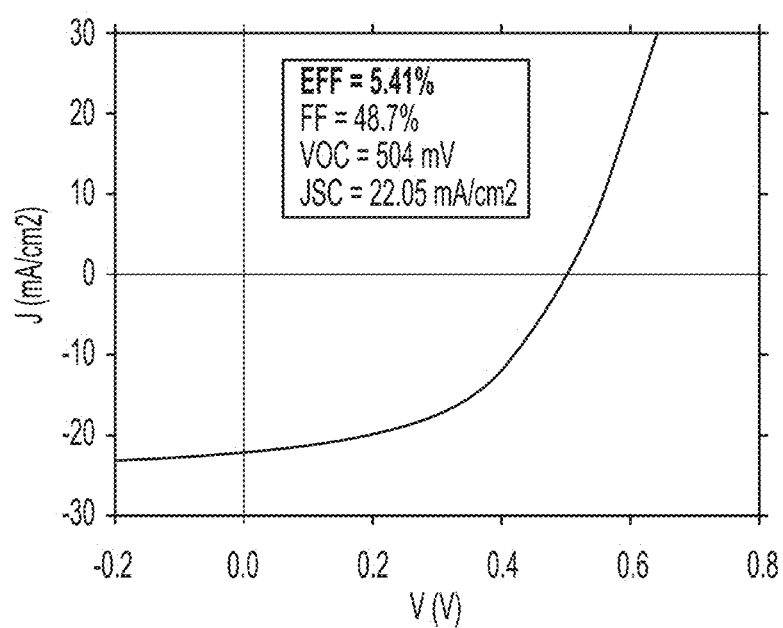
FIG. 4 shows a graph showing the performance of a photovoltaic device comprising an AZTSSe photovoltaic absorber layer and an FTO back contact.

FIG. 4 shows a current density vs. voltage (JV) graph showing the improved performance when FTO replaces the Mo substrate in the photovoltaic device. A current density-voltage curve is similar to a current-voltage (IV) curve except that the y-axis units are in mA/cm$^2$ rather than amps. The IV curve of a solar cell is the superposition of the IV curve of the solar cell diode in the dark with the light-generated current. The light has the effect of shifting the IV curve down into the fourth quadrant where power can be extracted from the diode. Several important parameters used to characterize solar cells, the short-circuit current density ($J_{SC}$), the open-circuit voltage ($V_{OC}$), the fill factor (FF) and the efficiency are all parameters determined from the JV curve. In this embodiment, the photovoltaic device has an efficiency of 5.41%, a fill factor (FF) of 48.7%, an open circuit voltage ($V_{OC}$) of 504 mV, and a short circuit current density ($J_{SC}$) of 22.05 mA/cm$^2$.

Figure 5:
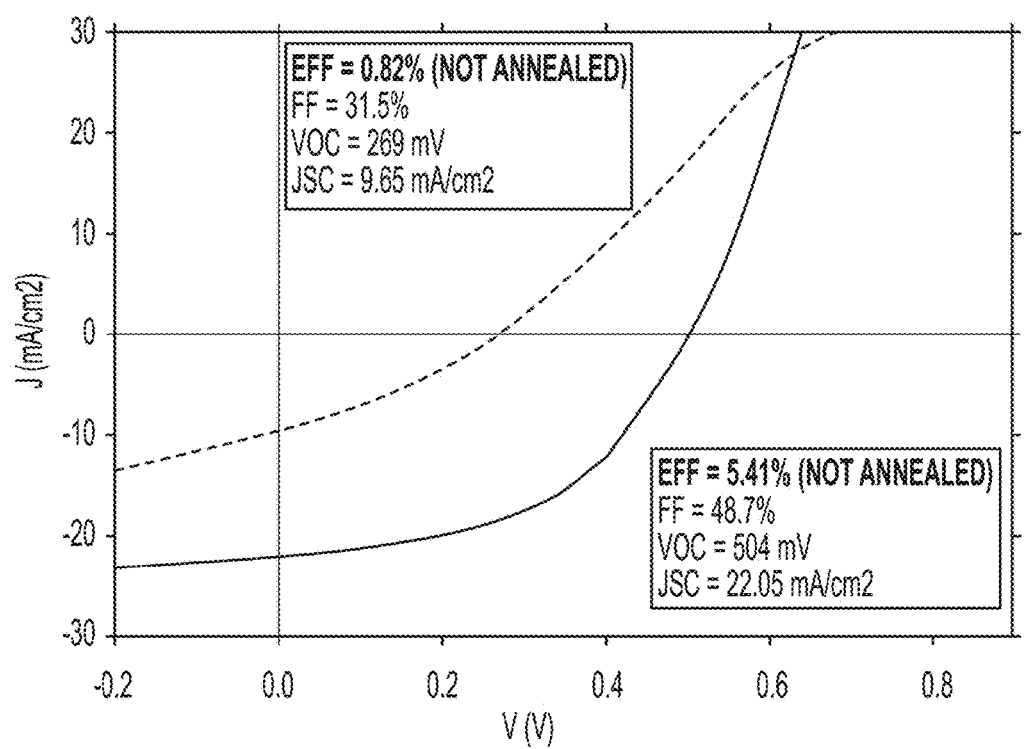
FIG. 5 shows a graph comparing the performance of an annealed vs. a non-annealed photovoltaic device comprising an AZTSSe photovoltaic absorber layer and an FTO back contact.

FIG. 5 shows a graph comparing the performance of annealed vs. non-annealed AZTSSe material in photovoltaic devices. With FTO as the back contact, the annealed films performed much better than the non-annealed films. In this instance, the improvements in microstructural properties during annealing result in improved device performance (whereas with a Mo electrode these were outweighed by the non-Ohmic back contact) As shown in FIG. 3, the opposite result was obtained when Mo was used as the back contact. All the parameters are lower in the non-annealed device which has an efficiency of 0.82%, a fill factor (FF) of 31.5%, an open circuit voltage ($V_{OC}$) of 269 mV, and a short circuit current density ($J_{SC}$) of 9.65 mA/cm$^2$.

Figure 6:
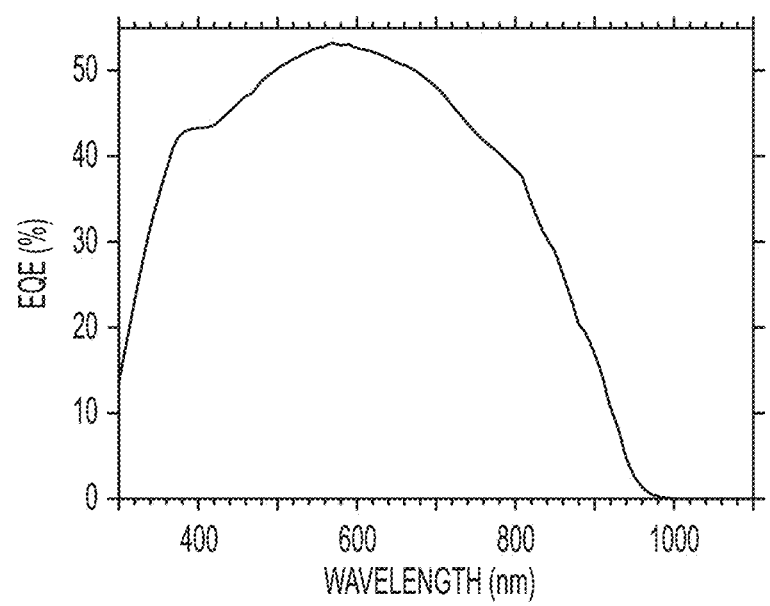
FIG. 6 shows a graph showing the EQE % vs. wavelength of a photovoltaic device comprising an AZTSSe photovoltaic absorber layer and an FTO back contact.

FIG. 6 shows a graph of the External Quantum Efficiency (EQE) vs. the wavelength of light. As shown in FIG. 6, the photovoltaic device comprising the AZTSSe material in combination with the FTO back contact displays excellent EQE across a wide range of the visible light spectrum. Preferably, the EQE vs. wavelength graph has a box-like shape.

An exemplary methodology for fabricating a photovoltaic device is described below. To begin the process, a substrate is provided. A suitable substrate includes, but is not limited to, a soda-lime glass substrate, a plastic substrate, or a metal foil (e.g., aluminum (Al) foil or stainless steel foil) substrate. According to an exemplary embodiment, the substrate is from about 0.1 millimeter (mm) to about 3 mm thick. Next, the substrate is coated with FTO. According to an exemplary embodiment, the FTO layer is deposited onto the substrate by sputtering to a thickness of from about 400 nanometers (nm) to about 2 micrometer (µm). The substrate and FTO layer will also be referred to herein as a FTO-coated substrate.

An absorber layer is then formed on the FTO-coated substrate. In this example, the constituent components of the absorber layer are silver (Ag), zinc (Zn), tin (Sn) and sulfur (S) and/or selenium (Se), i.e., AZTSSe. As shown in FIG. 1, the constituent components of the absorber layer are deposited on the FTO-coated substrate, wherein the deposited constituent components are represented generically by box 3.

The deposition of the absorber layer constituent components can be carried out in a number of different ways as described below. In each case, however, the S and Se constituent components are provided each from separate cracking cells, or from a sulfur/selenium overpressure during annealing. As will be described in detail below, use of cracking cells is one way to regulate the flux of the S and the flux of the Se thus providing a precise control over the S/(S+Se) or Se/(S+Se) ratio of these components in the absorber layer.

According to the present teachings, the deposition of the S and Se from the cracking cells occurs via a thermal evaporation process. Thus, in one exemplary embodiment, the deposition of the Ag, Zn and Sn is also conducted using thermal evaporation, i.e., the Ag, Zn, Sn, S and Se are co-evaporated at same time. In this example, an Ag source, a Zn source and a Sn source are placed in a vapor chamber along with the FTO-coated substrate. The Ag source, Zn source and Sn source can be three crucibles or Knudsen sources containing Ag, Zn and Sn, respectively, placed in the vapor chamber with the FTO-coated substrate and the sulfur and/or selenium crackers. The Ag, Zn, Sn, S and Se can then be deposited on the FTO-coated substrate with the S and Se being introduced to the vapor chamber from each of two cracking cells (one containing the S and the other containing the Se, i.e., the S source and the Se source, respectively).

This particular embodiment with exemplary cracking cells is described below. However, in general, a conduit is provided between the cracking cells and the vapor chamber. Each cracking cell includes a bulk zone which contains a reservoir of the bulk element, i.e., in this case S or Se, a cracking zone (i.e. a region of elevated temperature for thermally cracking, e.g. S$_8$ molecules into atomic S) and a needle valve between the bulk zone and the cracking zone to precisely control the amount (flux) of the respective element introduced into the cracking zone and hence into the vapor chamber. The general functions and operation of a cracking cell are known to those of skill in the art and thus are not described further herein.

The S/(S+Se) or Se/(S+Se) ratio can be determined by the S flux and the Se flux into the vapor chamber. The more S flux, the higher the S/(S+Se) ratio will be. The more Se flux, the higher the Se/(S+Se) ratio will be. The use of cracking cells allows for control of the S and Se fluxes into the vapor chamber in a couple of different ways. First, the needle valve can be used to regulate the flow of S and/or Se into the cracking zone and hence into the vapor chamber. According to an exemplary embodiment, the needle valve can be adjusted from 0 milli-inch (closed position) to about 300 milli-inch (fully open position). Second, the bulk zone temperature can be regulated to regulate the S and/or Se fluxes. These flux adjustment measures can be operated independently (i.e., controlling the fluxes via adjustments to the needle valve or to the bulk zone temperature) or in combination (i.e., controlling the fluxes by varying both the needle valve position and bulk zone temperature). By way of example only, if the bulk zone in the S cracking cell is kept at 170 degrees Celsius (° C.), the S pressure inside the bulk zone is about $1\times10^5$ Torr (an estimation). If the needle valve is closed to 'O', the flux of S is 0. If the needle valve is then opened to 100 milli-inch, there will be some flux, about $3\times10^6$ Torr. If the needle valve is fully opened, the S flux will be same as the pressure in the bulk zone. So with the needle valve adjustments the S flux can be precisely and quickly tuned to flux from 0 to $1\times10^5$ Torr. However if a flux higher than $1\times10^5$ Torr is needed, then the bulk temperature needs to be further increased. The same procedure applies to the Se. A benefit to using the needle valve adjustment is that the S and Se bulk zones are typically very large and the temperature change requires 1 to 3 hours to stabilize, which is not desirable. Needle valve control is immediate.

Further, the cracking cell can be used to crack the S and Se molecules into smaller more reactive elements which will assist the material growth and can improve the quality of the resulting absorber layer. By way of example only, $S_8$ molecules can be cracked into $S_4$, $S_2$ or even $S_1$ molecules, and $Se_4$ molecules can be cracked into $Se_2$ molecules in the cracking zone. The temperature for the cracking zone is regulated separately from the bulk zone. For example, the cracking zone temperature is at least 200° C. higher than the bulk zone temperature because a cold cracking zone will condense the S or Se, and the condensed material will block the cell. Typically the cracking zone temperature for S/Se is from about 400° C. to about 1,000° C.

Alternatively, the Ag, Zn and Sn can be deposited on the FTO-coated substrate by a method other than thermal evaporation. By way of example only, other suitable deposition processes include, but are not limited to, sputtering, electron-beam evaporation, solution-processing, physical vapor deposition or chemical vapor deposition (CVD). Each of these deposition processes are known to those of skill in the art and thus are not described further herein. In this alternative example, the Ag, Zn and Sn constituent components are first deposited on the FTO-coated substrate using one (or more) of these other deposition processes. Then the substrate is placed in a vapor chamber for the S and Se deposition which occurs via thermal evaporation as described herein. In another embodiment, a low-work function layer is deposited in between the FTO-coated substrate and AZTSSe, such as an intermediate layer Another method for controlling the ratio of sulfur to selenium is to anneal the sample in a vapor containing the other chalcogen species. For example, a pure-selenide AZTSe sample could be annealed in a vapor containing sulfur to incorporate sulfur into the structure. By controlling the S:Se ratio in the annealing ambient, the S:Se ratio in the absorber can be tuned.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The methods depicted herein are just one example. There may be many variations to the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A photovoltaic device, comprising:
   a substrate;
   a back contact comprising a low-work function material selected from the group consisting of fluorinated tin oxide ($SnO_2$:F or FTO), ZnO:Al, ZnO:B, $In_2O_3$:Sn, $In_2O_3$:Zn, $TiB_2$, $LaB_6$, and $TiO_2$:Nb;
   a photovoltaic absorber material layer comprising an n-type AZTSSe material on a side of the back contact opposite the substrate, the n-type AZTSSe material comprising Ag, Zn, Sn, S, and Se;
   wherein the back contact forms an Ohmic contact with the photovoltaic absorber material layer;
   a Schottky contact layer comprising $MoO_3$ on a side of the absorber layer opposite the back contact; and
   a top electrode on a side of the Schottky contact layer opposite the absorber layer.

2. The photovoltaic device of claim 1 wherein the low-work function material comprises fluorinated tin oxide ($SnO_2$:F or FTO).

3. The photovoltaic device of claim 1 wherein the photovoltaic absorber material layer is annealed with the back contact.

4. The photovoltaic device of claim 1 wherein the n-type AZTSSe material of the photovoltaic absorber material layer comprises has a Ag/Sn ratio of about 1.6 to about 2.3.

5. The photovoltaic device of claim 1 wherein the n-type AZTSSe material of the photovoltaic absorber material layer has a Zn/Sn ratio of about 0.75 to about 1.45.

6. The photovoltaic device of claim 1 wherein the n-type AZTSSE material of the photovoltaic absorber material layer has a ratio of (Ag+Zn+Sn) to (S+Se) of about 0.8 to about 1.

7. The photovoltaic device of claim 1 wherein the n-type AZTSSE material of the photovoltaic absorber material layer has a ratio of S to Se of about 0.25 to about 1.

8. The photovoltaic device of claim 1 wherein the substrate comprises a glass, plastic, ceramic or a metal foil substrate.

9. The photovoltaic device of claim 1 wherein the top electrode comprises a transparent conductive oxide.

10. The photovoltaic device of claim 1 wherein the substrate is FTO-coated and the photovoltaic device comprises a low-work function material layer between the substrate and the photovoltaic absorber material layer.

11. A method for making a photovoltaic device, the method comprising:
    providing a substrate;
    forming a back contact comprising a low-work function material on the substrate, the low work function material selected from the group consisting of fluorinated tin oxide ($SnO_2$:F or FTO), ZnO:Al, ZnO:B, $In_2O_3$:Sn, $In_2O_3$:Zn, $TiB_2$, $LaB_6$, and $TiO_2$:Nb;
    forming a photovoltaic absorber material layer comprising an n-type AZTSSe material on a side of the back contact opposite the substrate wherein an Ohmic contact is formed between the low-work function material and the photovoltaic absorber material layer, the n-type AZTSSE material comprising Ag, Zn, Sn, S, and Se;

forming a Schottky contact layer on a side of the absorber layer opposite the back contact, the Schottky contact layer comprising $MoO_3$; and forming a top electrode on a side of the Schottky contact layer opposite the absorber layer.

12. The method of claim 11 wherein the low-work function material comprises fluorinated tin oxide ($SnO_2$:F or FTO).

13. The method of claim 11 wherein the photovoltaic absorber material layer is annealed with the back contact.

14. The method of claim 11 wherein the n-type AZTSSe material of the photovoltaic absorber material layer has a ratio of Ag to Sn of about 1.6 to about 2.3.

15. The method of claim 11 wherein the n-type AZTSSe material of the photovoltaic absorber material layer has a ratio of Zn to Sn of about 0.75 to about 1.45.

16. The method of claim 11 wherein the n-type AZTSSe material of the photovoltaic absorber material layer has a ratio of (Ag+Zn+Sn) to (S+Se) of about 0.8 to about 1.2.

17. The method of claim 11 wherein the n-type AZTSSe material of the photovoltaic absorber material layer has a ratio of S to Se of about 0.25 to about 1.

18. A photovoltaic device, comprising:

a glass substrate;

a back contact selected from the group consisting of fluorinated tin oxide ($SnO_2$:F or FTO), ZnO:Al, ZnO:B, $In_2O_3$:Sn, $In_2O_3$:Zn, $TiB_2$, $LaB_6$, or $TiO_2$:Nb;

a photovoltaic absorber material layer comprising an n-type $Ag_2ZnSn(S,Se)_4$ material on a side of the back contact opposite the substrate;

wherein the back contact forms an Ohmic contact with the photovoltaic absorber material layer a Schottky contact layer comprising $MoO_3$ on a side of the absorber layer opposite the back contact;

a top electrode on a side of the Schottky contact layer opposite the absorber layer; and a metal contact grid on a side of the top electrode opposite the Schottky contact layer.

* * * * *